United States Patent [19]
Tanuma et al.

[11] Patent Number: 5,311,403
[45] Date of Patent: May 10, 1994

[54] PRINTED SUBSTRATE FOR MOUNTING HIGH-POWER SEMICONDUCTOR CHIP THEREON AND DRIVER COMPONENT MAKING USE OF THE PRINTED SUBSTRATE

[75] Inventors: Jiro Tanuma; Naoji Akutsu; Chihiro Komori; Hideaki Ishimizu, all of Tokyo, Japan

[73] Assignee: Oki Electric Industry Co., Ltd.

[21] Appl. No.: 788,537

[22] Filed: Nov. 6, 1991

[30] Foreign Application Priority Data

Nov. 6, 1990 [JP] Japan ................................ 2-299076

[51] Int. Cl.$^5$ .............................................. H05K 1/18
[52] U.S. Cl. ................................. 361/761; 361/752; 361/792; 361/810; 174/52.2
[58] Field of Search ............... 361/386, 388, 396, 397, 361/399, 400, 401, 402, 414, 420, 704, 707, 744, 748, 752, 760, 761, 762, 792, 810; 174/52.2; 357/65, 68, 71, 72, 80; 257/686, 700, 723, 786

[56] References Cited

U.S. PATENT DOCUMENTS

| | | | |
|---|---|---|---|
| 4,285,002 | 8/1981 | Campbell | 357/74 |
| 4,486,945 | 12/1984 | Aigoo | 29/588 |
| 4,993,148 | 2/1991 | Adachi et al. | 29/832 |

*Primary Examiner*—Leo P. Picard
*Assistant Examiner*—Young Whang
*Attorney, Agent, or Firm*—Wenderoth, Lind & Ponack

[57] ABSTRACT

A printed chip-on-board substrate is for mounting a high-power semiconductor chip. As a construction for efficiently releasing or dissipating heat to be generated in the semiconductor chip, the printed substrate has a printed interconnected substrate and a metal plate bonded on a back side of the substrate. The printed interconnected substrate is constructed by forming an interconnected layer on a surface of the substrate. At a mount area where the semiconductor chip is to be mounted, an opening is formed reaching the metal plate. The metal plate covers the opening on the side of the back side and is formed with a thickness capable of providing rigidity sufficient to support thereon at least the semiconductor chip to be mounted.

5 Claims, 4 Drawing Sheets

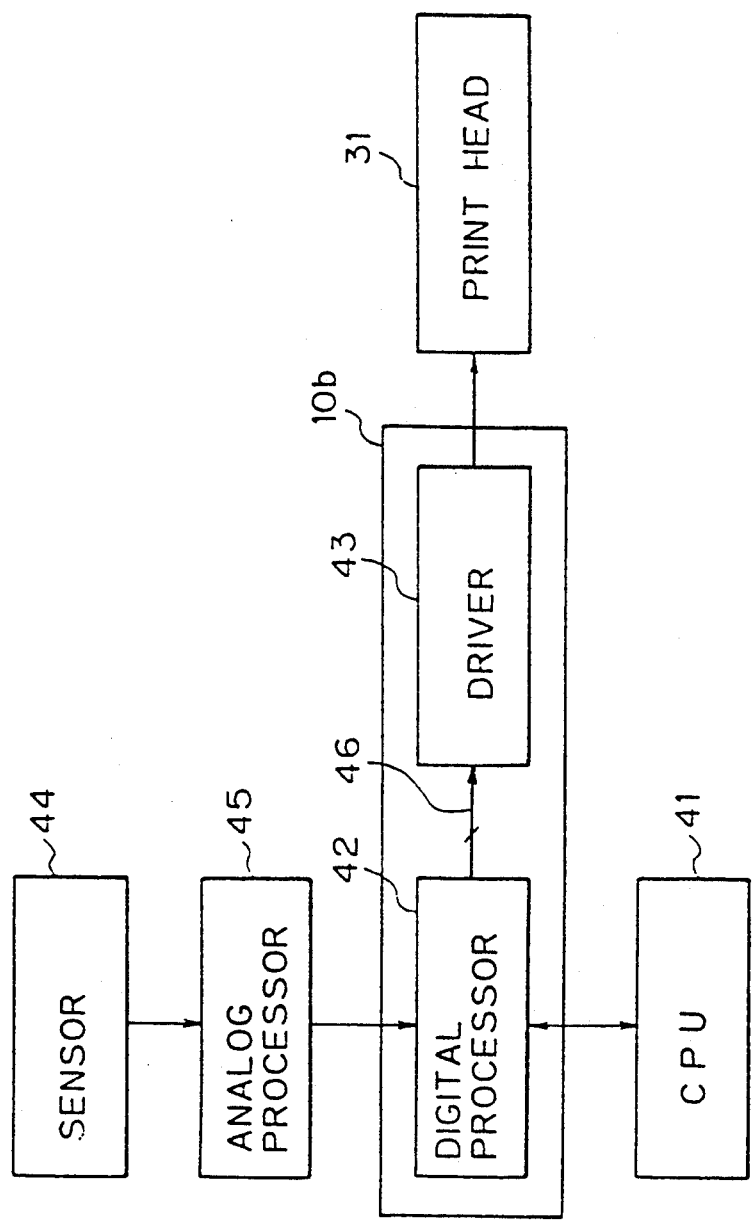

PRINTED SUBSTRATE FOR MOUNTING HIGH-POWER SEMICONDUCTOR CHIP THEREON AND DRIVER COMPONENT MAKING USE OF THE PRINTED SUBSTRATE

BACKGROUND OF THE INVENTION

1) Field of the Invention

This invention relates to a printed substrate for mounting a high-power semiconductor chip thereon and also to a driver component making use of the printed substrate.

2) Description of the Related Art

A high-power semiconductor chip for driving a driver component typified by a print head has conventionally been mounted on a chip-on-board printed substrate because of reduce dimension achieved by the use of the printed substrate.

FIG. 2 is a fragmentary cross-sectional view of a chip-on-board, which shows one example of the conventional arrangement. In the chip-on-board, a printed interconnected substrate 20 is constructed of an insulating substrate 21 and a printed interconnected layer 22 provided on a surface of the insulating substrate 21. The printed interconnected substrate 20 is also provided with a heat dissipator 23 disposed on the insulating substrate 21 as a means for permitting the mounting of a high-power semiconductor chip 24. The heat dissipator 23 is made of a metal plate having good thermal conductivity. The semiconductor chip 24 is bonded on the heat dissipator 23 and is connected to the printed interconnected layer 22 via wires 25. The heat dissipator 23, high-power semiconductor chip 24, printed interconnected layer 22 and wires 25, which are all mounted on the printed interconnected substrate 20, are enclosed with a sealing resin 26.

The heat dissipator 23 is provided on the chip-mounting area of the printed interconnected substrate 20, since it is more efficient at dissipating heat generated in the semiconductor chip 24, not only from the surface of the semiconductor chip 24 but also from the heat spreader 23 having a larger surface area than relying upon the former heat dissipation route alone.

Heat dissipation through a printed interconnected substrate, as described above, is effective for semiconductor chips of relatively small power consumption, but is insufficient for mounting semiconductor chips of large power consumption exceeding several watts for which the demand has been increasing in recent years. For example, the number of wire dot pins used in a wire dot print head has increased as a result of the recent trend toward higher print quality. This has led to an increase in the electric power (watt) applied to a semiconductor chip for driving the wire dot print head so that the quantity of heat generated in such a semiconductor chip is ever increasing.

SUMMARY OF THE INVENTION

An object of the present invention is to provide a printed substrate for mounting a high-power semiconductor chip thereon, said substrate permitting effective dissipation or release of heat generated in the high-power semiconductor chip.

Another object of the present invention is to provide a driver component which permits effective conduction and dissipation of heat, which is produced in a semiconductor chip mounted on a printed substrate, to a metal casing of the driver component.

The present invention therefore provides a printed substrate comprising:
a printer interconnected substrate constructed of an insulating substrate and an interconnected layer formed on at least one principal surface thereof, and
a metal plate bonded on another principal surface of the printed interconnected substrate; and
said interconnected substrate defining an opening at a mount area where a semiconductor is to be mounted, said opening reaching said metal plate, and said metal plate covering said opening and having a thickness capable of providing rigidity sufficient to support at least the semiconductor chip to be mounted thereon.

The present invention also provides a driver component comprising:
a printed substrate constructed of a printed interconnected substrate, which is in turn constructed of an insulating substrate and an interconnected layer formed on at least one principal surface thereof, and a metal plate bonded on another principal surface of the printed interconnected substrate, and
a driving element having a metal-made casing; and
said printed interconnected substrate defining an opening at an area where a semiconductor chip is to be mounted, said opening reaching said metal plate,
said metal plate covering said opening and having a thickness capable of providing rigidity sufficient to support at least the semiconductor chip to be mounted thereon, and
said metal plate being in close contact with the casing of the driving element.

The printed substrate according to the present invention is provided with the metal plate on which a semiconductor chip is directly to be mounted. The efficiency of heat dissipation has hence been improved, thereby making it possible to mount a high-power semiconductor chip of several watts or more.

In the driver component according to the present invention, the above printed substrate is maintained in close contact with the metal-made casing. As a result, heat which is generated in the semiconductor chip mounted on the printed substrate can be effectively dissipated, so that the semiconductor chip can be protected from overheating and the reliability of the driver component can be improved.

BRIEF DESCRIPTION OF THE DRAWINGS

FIG. 4 is a block diagram of a controller for a printer; and

DETAILED DESCRIPTION OF THE INVENTION AND PREFERRED EMBODIMENT

Figure 1:
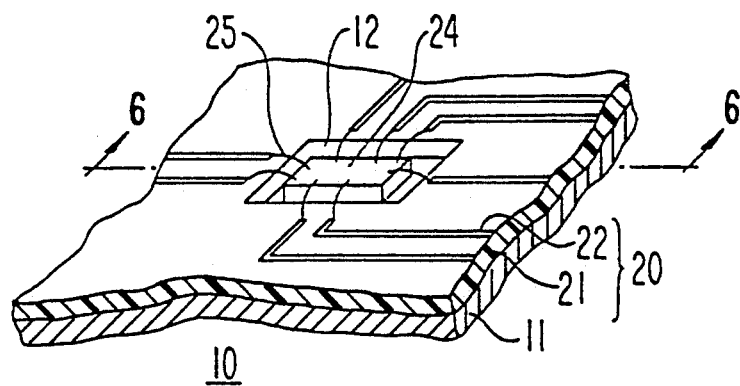
FIG. 1 is a fragmentary perspective view of a printed substrate according to a first embodiment of the present invention.
Figure 6:
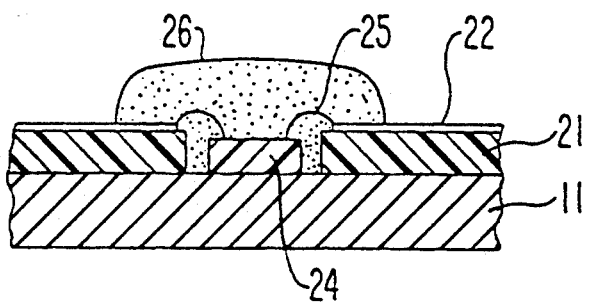
FIG. 6 is a fragmentary cross-sectional view of the printed substrate of FIG. 1, taken in the direction of arrows 6—6.
Figure 2:
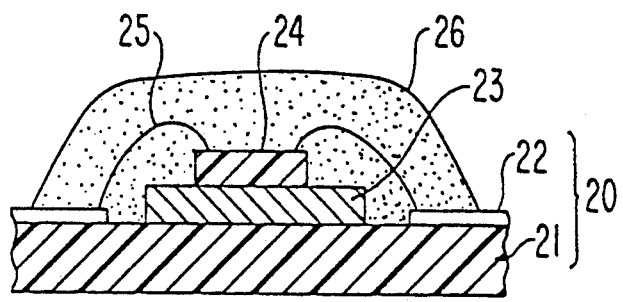
FIG. 2 is a fragmentary cross-sectional view of a conventional printed substrate.

Referring first to FIGS. 1 and 6, the printed substrate according to the first embodiment of the present invention will be described. The printed substrate, which is generally designated at numeral 10, is constructed of a printed interconnected substrate 20 and a metal plate 11. The printed interconnected substrate 20 is in turn formed of an insulating substrate 21 with a printed interconnected layer 22 formed on a front surface thereof. The metal plate 11 is bonded on a back surface of the insulating substrate 21.

The printed interconnected substrate 20 defines, at a semiconductor-chip-mounting area, an opening 12 having a sufficient size to receive a semiconductor chip 24 to be mounted. The surface of the metal plate 11 is exposed in the bottom of the opening 12. As the printed interconnected substrate 20, a double-sided interconnected substrate with interconnected layers on each surface thereof or an interconnected multilayer substrate may be used as needed. In this case, it is necessary to cover the interconnected layer on the back surface with an insulating layer to avoid shorting between the interconnected layer on the back surface and the metal plate 11.

A metal having high thermal conductivity is used for the metal plate 11. For example, copper is preferred. Although a thicker metal plate is preferable, it is sufficient as long as the metal plate 11 has a thickness capable of providing sufficient rigidity to successfully support the semiconductor chip 24 when the semiconductor chip 24 is mounted on the surface of the metal plate 11. The metal plate 11 is formed of a size which is large enough to cover at least the opening 12. Further, it is preferable to provide a solder layer on the surface of the metal plate 11 because the solder layer facilitates the bonding of the semiconductor chip 24. The solder layer can also protect the surface from oxidation. The bonding between the metal plate 11 and the printed interconnected substrate can preferably be conducted using a resin adhesive such as an epoxy adhesive.

The bonding of the semiconductor chip 24 to the printed substrate 10 is conducted by soldering, since solder bonding can provide higher thermal conductivity compared to resin bonding and undergoes a smaller reduction in bonding force than resin bonding when exposed to varied temperatures. The metal plate 11 may be used as a ground for the semiconductor chip 24 or, alternatively, may be used under in a floating manner without being connected with the semiconductor chip 24. Needless to say, electrical connection between the semiconductor chip 24 and the printed interconnected layer 22 can be effected by wire bonding, for example, by using the wires 25 or the like. A sealing resin 26 is then applied on the semiconductor chip 24 and wires 25 to enclose them as illustrated in FIG. 6, whereby the semiconductor chip 24 and wires 25 are protected as in the conventional art.

Owing to the above-described construction of the printed substrate 10, the following advantageous effects can be brought about.

The metal plate 11 is exposed at the back side thereof so that effective dissipation of heat is feasible without interference by the sealing resin 26 covering the semiconductor chip 24. By bonding the semiconductor chip 24 to the metal plate 11 with a solder without interposition of any insulating layer, heat generated in the semiconductor chip 24 can be effectively conducted to the metal plate 11. By forming the metal plate 11 with a relatively large area and connecting a ground of the semiconductor chip 24 to the metal plate 11, noise is reduced owing to the electric capacitance of the metal plate 11.

Figure 3:
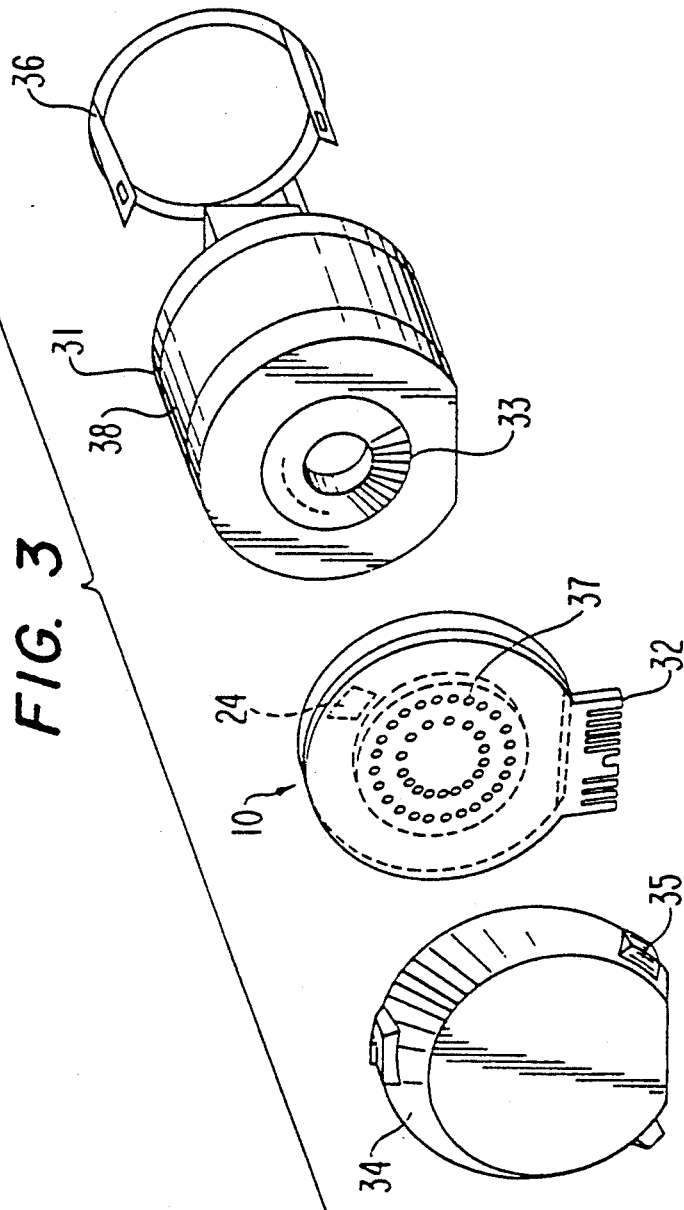
FIG. 3 is an exploded perspective view of a print head making use of a printed substrate according to a second embodiment of the present invention, said printed substrate being suitable for use in mounting a high-power semiconductor chip thereon.

Referring next to FIG. 3, the driver component according to the second embodiment of the present invention will be described.

A printed substrate 10 similar to that described in connection with the first embodiment is formed in a circular shape having a size conforming with the contour of a back side of a wire dot print head 31. The printed substrate 10 has input terminals 32 for feeding electric power or inputting control signals to drive the wire dot print head 31 as well as output terminals 37 for providing electrical connection between the printed substrate 10 and the wire dot print head 31.

The wire dot print head 31 is provided with a metal-made casing 38 and is connected to the output terminals 37 of the printed substrate 10 by way of a head coil bobbin 33 disposed on the back side of the wire dot print head 31.

The printed substrate 10 and the head coil bobbin 33 are electrically connected and fixedly positioned relative to each other owing to fitting of the output terminals 37 of the printed substrate 10 in the head coil bobbin 33. Any spacing between the output terminals 37 of the printed substrate 10 and the head coil bobbin 33 may preferably be filled out with silicone grease, thereon or a Miller film (mica sheet). In the state so assembled, the whole structure is fixed under compression by clamps 36 attached to a front cover and corresponding detents 35 provided on a back cover 34.

Since the printed substrate 10 and the wire dot print head 31 are connected as described above, the second embodiment of the present invention can bring about the following advantageous effects.

Heat generated in the semiconductor chip 24 mounted on the printed substrate 10 can be effectively conducted to the metal-made casing 38 of the wire dot print head 31, which is also made of a metal, by way of the metal plate 11. Even when the print head 31 has become hot due to its intense movements, the temperature of the print head 31 is still as low as 100° C. or less. Heat generated in the semiconductor chip 24 can still be conducted effectively to the print head 31 as the temperature of the semiconductor chip 24 rises far beyond 100° C.

To ensure effective thermal conduction, it is preferable to maintain the metal plate 11 in close contact with the back surface of the wire dot print head 31. It is however not very wise from the standpoint of manufacturing cost to polish up the back surface of the wire dot print head into a mirror surface in order to have it closely contacted with the metal plate 11. As a matter of fact, it is difficult to achieve the close contact even when the back surface of the wire dot print head 31 is polished up into a mirror surface, because the surfaces of the wire dot print head 31 has to be coated with a rust preventive layer or an insulating layer to avoid accidental shorting with wiring of a printer in which the wire dot print head 31 is accommodated. In the above embodiment, silicone grease or the like is interposed to improve the close contact between the metal plate 11 and the wire dot print head 31. Silicone grease or the like is an insulating material and its thermal conductivity is not very good. The thermal conductivity is however still better compared to the situation that the contact between the metal plate 11 and the back surface of the wire dot print head 31 is loose and air is present in the spacing.

The third embodiment of the present invention will now be described.

In the printer controller of FIG. 4, information inputted from CPU 41 is converted into a drive signal for the print head 31 by a digital processor 42. The drive signal is fed to the print head 31 via a driver 43, whereby the print head 31 is driven. In some printers, a signal which has been detected by a sensor 44 provided inside the print head 31 is digitized by an analog processor 45 and is then outputted to the digital processor 42, where a drive signal to be outputted to the print head 31 is controlled in accordance with the detection signal.

In such a printer controller, it is preferable to mount both the digital processor 42 and the driver 43 on a common printed substrate 10b and then to connect them via parallel interconnects 46 because this construction permits high-speed control of printing. Further, the use of serial interconnects between the printed substrate 10b and the analog processor 45 and between the printed substrate 10b and CPU 41 can reduce the number of input/output interconnects, thereby making their interconnection easier.

Figure 5:
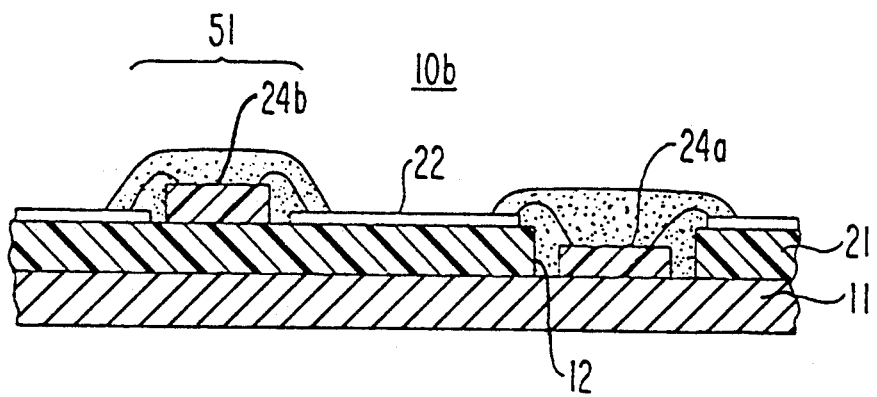
FIG. 5 is a fragmentary cross-sectional view of a printed substrate according to a third embodiment of the present invention.

The printed substrate according to the third embodiment of the present invention will next be described with reference to FIG. 5. The printed substrate generally designated at numeral 10b is suitable for such a preferred printer controller as described above. Similarly to the printed substrate 10 described above, the printed substrate 10b is constructed of a metal plate 11 and an insulating substrate 21 having a printed interconnected layer 22 provided on a surface thereof.

The insulating substrate 21 defines an opening 21 for mounting a semiconductor chip 24a which includes the driver 43, and also has a semiconductor-chip-mounting area 51 for mounting a semiconductor chip 24b in which the digital processor 42 is formed.

The semiconductor chip 24a is a high-power semiconductor chip because of the inclusion of the driver 43 so that its bottom is maintained in close contact with the metal plate 11. On the other hand, the semiconductor chip 24b is a low-power semiconductor chip as the digital processor 42 requires only small electric power. The semiconductor chip 24b is therefore mounted on the insulating substrate 21. Heat generated in the semiconductor chip 24a is blocked by the insulating substrate 21 having low thermal conductivity and is not conducted to the semiconductor chip 24b.

Owing to the construction described above, the metal plate 11 serves to dissipate heat generated in the semiconductor chip 24a but does not serve to conduct the heat to the semiconductor chip 24b.

In the above embodiment, the present invention was described taking the print head as an example. It is however to be noted that the present invention can be applied as a driver component to a wide variety of apparatus insofar as, like motors, they are controllable by a high-power semiconductor chip and are equipped with a casing made of a material having good thermal conductivity such as a metal.

We claim:

1. A printed substrate comprising:
    a printed interconnected substrate constructed of an insulating substrate and an interconnected layer formed on at least one principal surface thereof, and
    a metal plate bonded by an adhesive on another principal surface of the printed interconnected substrate;
    said printed interconnected substrate defining a first mounting area having an opening where a first semiconductor chip of relatively high power consumption is to be mounted, said opening reaching said metal plate, and defining a second mounting area being devoid of an opening where a second semiconductor chip of relatively low power consumption is to be mounted, and
    said metal plate covering said opening and having a thickness capable of providing rigidity sufficient to support at least the first semiconductor chip to be mounted thereon.

2. The printed substrate of claim 1, wherein said metal plate is a copper plate and a solder layer is formed on the copper plate at least in the opening of the printed interconnected substrate.

3. The printed substrate of claim 2, further comprising the first semiconductor chip mounted by the solder layer at the first mounting area of the printed interconnected substrate and the second semiconductor chip mounted at the second mounting area of the printed interconnected substrate.

4. A driver component comprising:
    a printed substrate constructed of a printed interconnected substrate, which is in turn is constructed of an insulating substrate and an interconnected layer formed on at least one principal surface thereof, and a metal plate bonded on another principal surface of the printed interconnected substrate;
    a driving element having a metal-made casing; and
    a filler material placed between the metal plate and the metal-made casing of the driving element to fill up a spacing between the metal plate and the casing of the driving element;
    said printed interconnected substrate defining an opening at an area where a semiconductor chip is to be mounted, said opening reaching said metal plate,
    said metal plate covering said opening and having a thickness capable of providing rigidity sufficient to support at least the semiconductor chip to be mounted thereon,
    said metal plate being in close contact with the casing of the driving element, and
    wherein the driving element is a print head.

5. A driver component comprising:
    a printed substrate constructed of a printed interconnected substrate, which is in turn is constructed of an insulating substrate and an interconnected layer formed on at least one principal surface thereof, and a metal plate bonded on another principal surface of the printed interconnected substrate,
    a driver element having a metal-made casing;
    said metal plate being in close contract with an outer surface of the casing of the driving element; and
    a filler material placed between the metal plate and outer surface of the casing of the driver element to fill up a spacing between the metal plate and the outer surface of the casing of the driving element;
    said printed interconnected substrate defining an opening at an area where a semiconductor chip is to be mounted, said opening reaching said metal plate,
said metal plate covering said opening and having a thickness capable of providing rigidity sufficient to support at least the semiconductor chip to be mounted thereon, and
wherein the driving element is a print head.

* * * * *